(12) United States Patent
Matsushima

(10) Patent No.: US 6,339,730 B1
(45) Date of Patent: Jan. 15, 2002

(54) PROCESSING SYSTEM

(75) Inventor: Keiichi Matsushima, Nirasaki (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/680,439

(22) Filed: Oct. 5, 2000

(30) Foreign Application Priority Data

Oct. 6, 1999 (JP) .......................................... 11-286098

(51) Int. Cl.[7] .............................................. G06F 7/00
(52) U.S. Cl. ....................... 700/218; 414/936; 414/939; 901/47; 318/568.16
(58) Field of Search ................................. 700/213, 214, 700/218, 112, 121; 414/935, 936, 937, 939; 901/46, 47, 9; 318/568.12, 568.16; 356/375, 400

(56) References Cited

U.S. PATENT DOCUMENTS

| | | |
|---|---|---|
| 4,819,167 A | 4/1989 | Cheng et al. |
| 5,452,521 A * | 9/1995 | Niewmierzycki ............ 33/520 |
| 5,483,138 A | 1/1996 | Shmookler et al. |
| 5,917,601 A | 6/1999 | Shimazaki et al. |
| 6,120,601 A * | 9/2000 | Landau et al. ................. 117/98 |
| 6,190,037 B1 * | 2/2001 | Das et al. ................... 374/121 |

* cited by examiner

Primary Examiner—Christopher P. Ellis
Assistant Examiner—Khoi H. Tran
(74) Attorney, Agent, or Firm—Smith, Gambrell & Russell, LLP

(57) ABSTRACT

A processing system comprises a plurality of processing vessels (8A to 8D) provided with openings in which a wafer (W) is subjected to predetermined processes, and a common transfer vessel (4) connected to the openings of the processing vessels. A transfer mechanism (14) capable of turning, bending and stretching is installed in the common transfer vessel to transfer the wafer (W) between the common transfer vessel (4) and the processing vessels (8A to 8D). Stand-by spaces (24A to 24D), where the wafer (W) is held temporarily, are determined so as to correspond to the openings of the processing vessels (8A to 8D), respectively. Position sensors (26-1 to 26-5) are assigned in pairs to the stand-by spaces to measure the position of the perimeter of the wafer. The position sensors are arranged so that each stand-by space (24A to 24D) shares one of the pair of position sensors with the adjacent stand-by space for common use. A control means determines an offset of the object held by the transfer mechanism on the basis of the position of the perimeter of the object detected by the position sensors and controls the operation of the transfer mechanism so as to correct the offset of the object.

7 Claims, 7 Drawing Sheets

PROCESSING SYSTEM

BACKGROUND OF THE INVENTION

1. Field of the Invention

The present invention relates to a processing system for processing an object to be processed, such as a semiconductor wafer, by a film forming process or the like and, more particularly, to a processing system capable of correcting errors in the position of an object to be processed held by a transfer mechanism.

2. Description of the Related Art

Generally, when fabricating a semiconductor integrated circuit, a surface of a semiconductor wafer, such as a silicon wafer, needs to be repeatedly subjected to film forming processes, oxidation-enhanced diffusion processes, etching processes, annealing processes and the like. To carry out those processes efficiently, a cluster tool system formed by connecting processing vessels for carrying out different processes therein to a common transfer vessel is employed and the wafer is transferred sequentially from one to the other of those vessels via the common transfer vessel to subject the wafer sequentially to the different processes.

Referring to FIG. 10 schematically showing a conventional processing system 2, three processing vessels 8A, 8B and 8C are connected via gate valves 6A, 6B and 6C, respectively, to a common transfer vessel 4. Stages 9A, 9B and 9C each provided on its upper surface with, for example, an electrostatic chuck that attracts and holds a wafer by electrostatic force are placed in the processing vessels 8A to 8C, respectively. Two cassette loading/unloading vessels, i.e., a first cassette loading/unloading vessel 12A and a second cassette loading/unloading vessel 12B, for keeping cassettes containing semiconductor wafers having a shape substantially resembling a disk are connected through gate valves 10A and 10B, respectively, to the common transfer vessel 4. A transfer mechanism 14 including, for example, an articulated arm capable of turning, bending and stretching is installed in the common transfer vessel 4. The transfer mechanism 14 holds a semiconductor wafer W and transfers the same between the cassette loading/unloading vessels 12A and 12B, and the processing vessels 8A to 8C, and between the processing vessels 8A to 8C.

Static electricity must be completely removed from a wafer W before taking the wafer W away from the stage 9A (or 9B or 9C) by the transfer mechanism 14. If the static electricity is not removed properly, it is possible that the static electricity causes the wafer W to jump up from the stage 9A (or 9B or 9C) and dislocate the wafer W and, consequently, the wafer W is held in a dislocated position by the transfer mechanism 14. Therefore, the wafer W must be transferred from the stage 9A (or 9B or 9C) to the transfer mechanism 14 so that the center of the wafer W coincides with the center of a holding device mounted on an end portion of an arm member 16 of the transfer mechanism 14 accurately (within an allowable positional error) scarcely dislocating the wafer W relative to the transfer mechanism 14.

Dislocation sensing devices are disclosed in, for example, JP-A No. 223732/1998 and U.S. Pat. No. 5,483,138. A conventional dislocation sensing device shown in FIG. 10 will be described by way of example. Pairs of linear sensors 18 and 20 spaced a predetermined distance apart from each other are disposed near the gate valves 6A to 6C of the processing vessels 8A to 8C, respectively. When carrying a wafer w past a position corresponding to the pair of linear sensors 18 and 20, the wafer W is stopped temporarily, and two positions of the perimeter of the wafer W are measured. An offset of the center of the wafer W from a reference point is determined on the basis of the measured position of the perimeter of the wafer W.

The pairs of expensive linear sensors 18 and 20, six linear sensors in this processing system, must be installed respectively for the processing vessels 8A to 8C. The expensive linear sensors increase the cost of the processing system. If the wafer W is dislocated by an offset exceeding an allowable limit, the transfer mechanism 14 must be stopped, the common transfer vessel 4 must be opened and a dislocation correcting operation must be carried out. In some cases, a high frequency voltage causes abnormal discharge when a dislocated wafer W is mounted on the stage without correcting the dislocation for a process using a plasma.

SUMMARY OF THE INVENTION

The present invention has been made in view of those problems and it is therefore an object of the present invention to provide a processing system capable of determining the dislocation of an object to be processed using a small number of position sensors and of automatically correcting the dislocation of the object.

With the foregoing object in view, according to the present invention, a processing system comprises: a plurality of processing vessels, in which an object to be processed is subjected to predetermined processes, provided with openings, respectively; a common transfer vessel connected to the openings of the processing vessels and internally having stand-by spaces, where the object is held temporarily, determined so as to correspond to the openings of the processing vessels, respectively; a transfer mechanism installed in the common transfer vessel to transfer the object between the common transfer vessel and the processing vessels and capable of turning, bending and stretching; a plurality of pairs of position sensors assigned to the stand-by spaces to measure the positions of the perimeter of the object and arranged so that each stand-by space shares one of the pair of position sensors with the adjacent stand-by space for common use; and a control means that determines an offset of the object held by the transfer on the basis of the position of the perimeter of the object detected by the position sensors and controls the operation of the transfer mechanism so as to correct the offset of the object.

When carrying the object held by the transfer mechanism into one of the processing vessels of the processing system, the object is stopped in the stand-by space corresponding to the processing vessel. The pair of sensors assigned to the stand-by space measure the positions of two points on the perimeter of the object. The control means determines an offset of the object held by the transfer mechanism on the basis of the respective positions of the two points on the perimeter of the object and controls the operation of the transfer mechanism so as to correct the offset of the object. Consequently, the object held by the transfer mechanism can be correctly placed at a predetermined position in the processing vessel, such as a predetermined position of a stage placed in the processing vessel.

Each stand-by space shares one of the pair of position sensors with the adjacent stand-by space for common use, and hence the number of the necessary position sensors is reduced accordingly. The reduction of the number of the necessary position sensors reduces the manufacturing cost of the processing system effectively.

The stand-by spaces may be arranged about the center of turning of the transfer mechanism at angular intervals of, for example, about 60°.

Preferably, the position sensors are linear optical sensors each having a photodetector of a predetermined length, and each position sensor is disposed so that the photodetector is aligned with a line passing the center of the object accurately placed in the corresponding stand-by space.

Preferably, the control means stops the operation of the transfer mechanism when the offset of the object is not smaller than a predetermined value.

The operation of the transfer mechanism is stopped when the offset is not smaller than the correctable limit to prevent the collision of the object against side wall of the processing vessel or the like with reliability.

According to the present invention, another processing system comprises: a processing vessel, in which an object to be processed is subjected to predetermined processes, provided with an opening; a transfer vessel connected to the opening of the processing vessels and internally having first and second stand-by spaces having centers spaced a predetermined angular interval apart, where an object to be processed is held temporarily; a transfer mechanism installed in the transfer vessel to transfer an object to be processed between the transfer vessel and the processing vessels, capable of turning, bending and stretching and having a center of turning about which the first and second stand-by spaces are arranged at an angular interval; a position sensor disposed so as to extend over the first and second stand-by spaces to measure the position of the perimeter of the object; and a control means that carries out a control procedure including the steps of determining the position of the perimeter of the object held by the transfer mechanism and located in the first stand-by space by the position sensor, making the transfer mechanism turn through an angle equal to the angular interval between the first and the second stand-by space to locate the object in the second stand-by space, determining the position of the perimeter of the object located in the second stand-by space by the position sensor, determining an offset of the object on the basis of the positions of the perimeter of the object as located in the first and the second stand-by space detected by the position sensor, and controlling the operation of the transfer mechanism so as to correct the offset of the object.

The object held by the transfer mechanism is stopped in the first stand-by space before being carried into the processing vessel and the position of the perimeter of the object is detected by the position sensor. Then, the transfer mechanism is turned through the angle corresponding to the predetermined angular interval between the first and the second stand-by space to move the object to the second stand-by space. The sensor detects the position of the perimeter of the object held in the second stand-by space. The control means determines an offset of the on the basis of two positions of the perimeter of the object detected by the position sensor and controls the operation of the transfer mechanism so as to correct the offset of the object. Consequently, the object held by the transfer mechanism can be carried to and accurately placed at predetermined position in the processing vessel, such as a proper position on a stage placed in the processing vessel.

Preferably, the position sensor is a linear optical sensor a photodetector of a predetermined length, and the position sensor is disposed so that the photodetector is aligned with a line passing the center of the object accurately placed in either of the first and the second stand-by space.

Preferably, the control means stops the operation of the transfer mechanism when the offset of the object is not smaller than a predetermined value.

DESCRIPTION OF THE PREFERRED EMBODIMENTS

Figure 1:
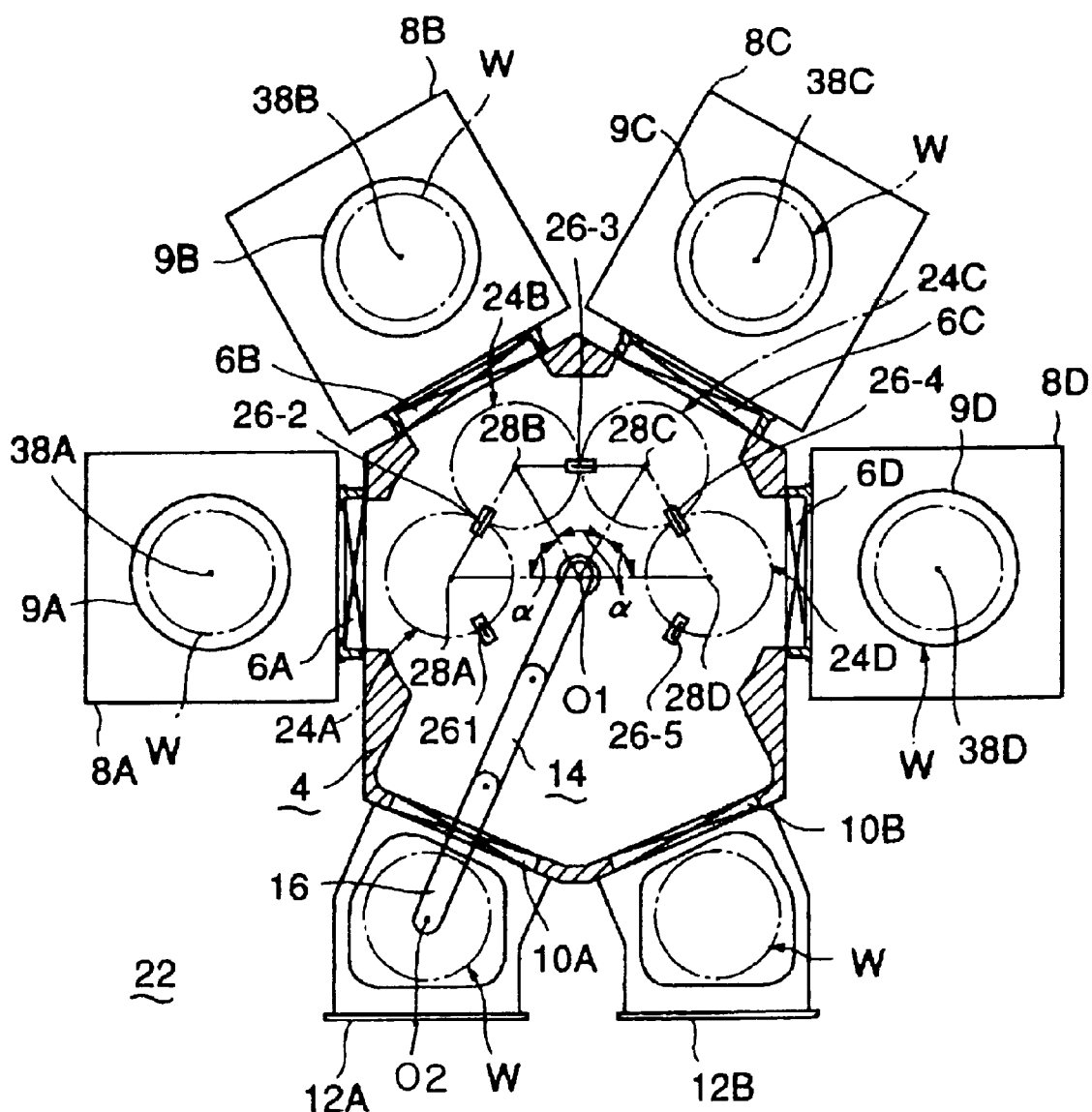
FIG. 1 is a sectional plan view of a processing system in a first embodiment according to the present invention.
Figure 2:
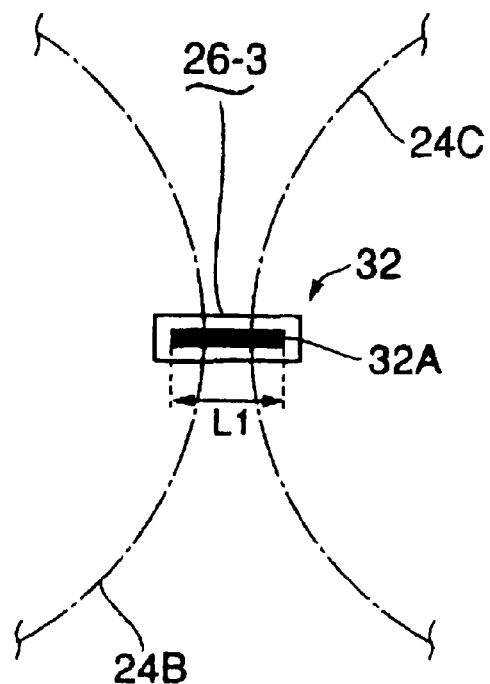
FIG. 2 is an enlarged view of a position sensor disposed for use both for detecting an object to be processed placed in a first stand-by space and for detecting an object to be processed placed in a second stand-by space.
Figure 3:
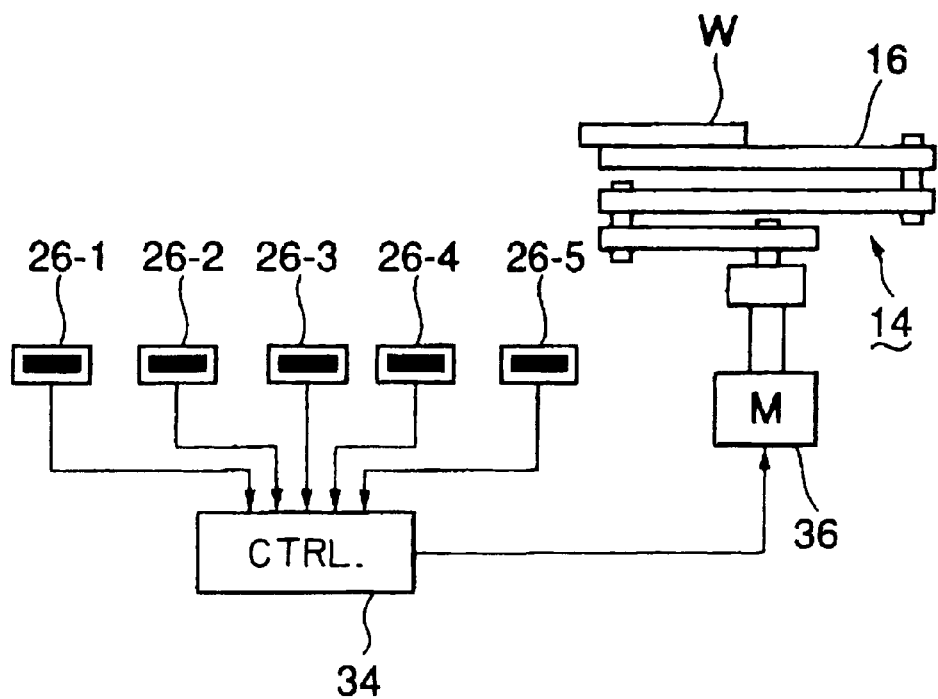
FIG. 3 is a block diagram of position sensors and a control system for controlling a transfer mechanism.
Figure 4:
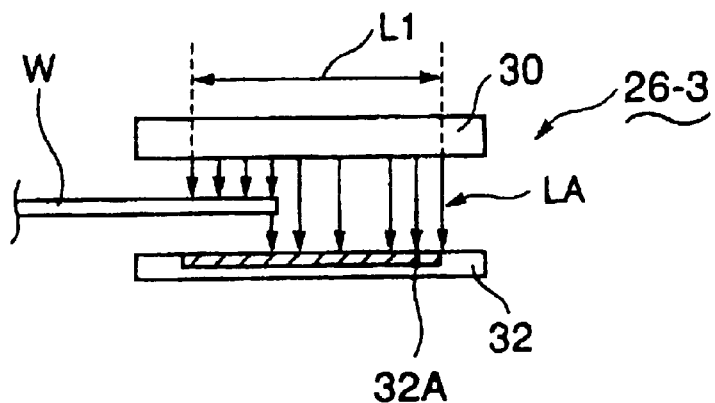
FIG. 4 is a typical view of assistance in explaining the relation between a position sensor and a wafer.
Figure 10:
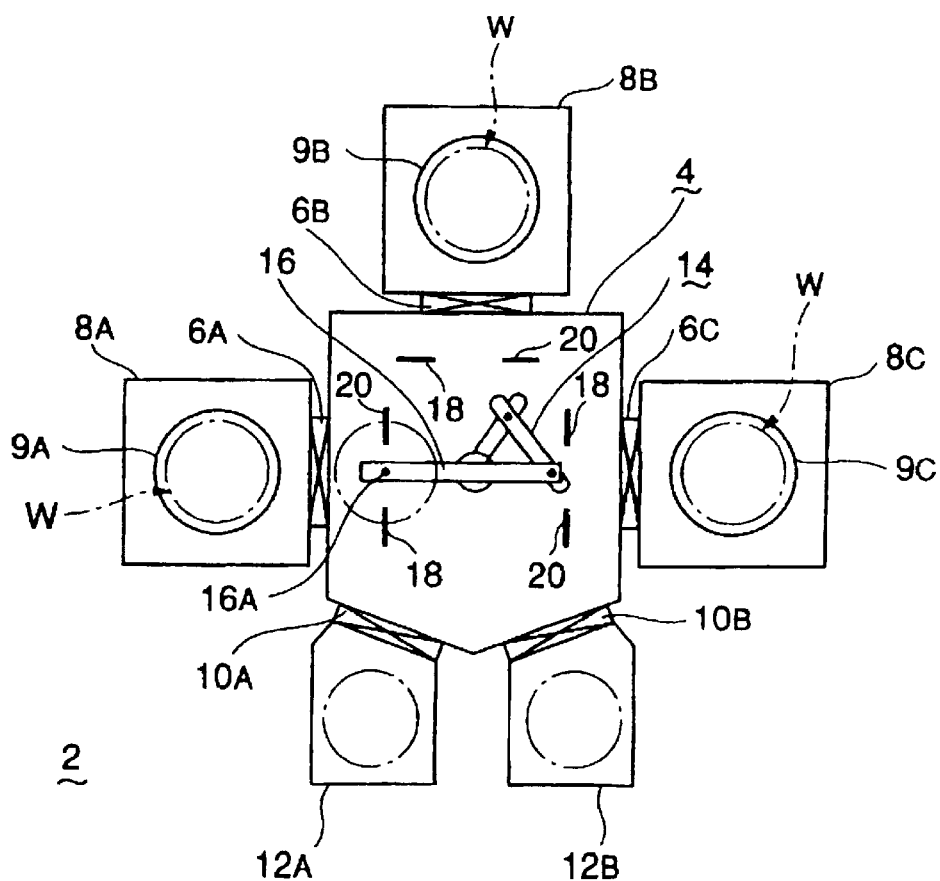
FIG. 10 is a schematic plan view of a conventional processing system.

A processing system in a first embodiment according to the present invention will be described with reference to the accompanying drawings. FIG. 1 is a sectional plan view of a processing system in a first embodiment according to the present invention, FIG. 2 is an enlarged view of a position sensor disposed for use both for detecting an object to be processed placed in a first stand-by space and for detecting an object to be processed placed in a second stand-by space, FIG. 3 is a block diagram of position sensors and a control system for controlling a transfer mechanism and FIG. 4 is a typical view of assistance in explaining the relation between a position sensor and a wafer. In FIGS. 1 to 4, parts like or corresponding to those of the conventional processing system previously described in connection with FIG. 10 are denoted by the same reference.

A processing system 22 has a common transfer vessel 4 having a substantially hexgonal cross section and capable of being evacuated. Four processing vessels 8A, 8B, 8C and 8D having openings provided with gate valves 6A, 6B, 6C and 6D, respectively, are connected to the common transfer vessel 4 in the form of a cluster tool system. Supporting tables 9A, 9B, 9C and 9D each provided on its upper surface with an electrostatic chuck that attracts and holds a semiconductor wafer W by an electrostatic force are placed in the processing vessels 8A to 8D. The processing vessels 8A to 8D may be designed for processing wafers by any processes. For example, the processing vessels 8A to 8D may be those of any devices that carry out some of plasma or thermal CVD processes, annealing processes, etching processes using a plasma or not using any plasma, oxidation-enhanced diffusion processes and the like.

Two cassette loading/unloading vessels 12A and 12B are connected through gate valves 10A and 10B, respectively, to the common transfer vessel 4. The cassette loading/ unloading vessels 12A and 12B are capable of containing cassettes containing a plurality of wafers W having a shape substantially resembling a disk. A transfer mechanism 14 including, for example, an articulated arm 16 capable of turning, bending and stretching is installed in a central space of the common transfer vessel 4. The arm 16 holds a semiconductor wafer W on its extremity and the transfer mechanism 14 transfers the semiconductor wafer W between the cassette loading/unloading vessels 12A and 12B and the processing vessels 8A to 8D and between the processing vessels 8A to 8D. It is preferable that the wafer W is held by a wafer holding device on the extremity of the arm 16 with its center aligned with the center 02 of the wafer holding device.

Stand-by spaces 24A, 24B, 24C and 24D are defined in the common transfer vessel 4 so as to correspond to the gate valves 6A to 6D of the processing vessels 8A to 8D, respectively. A wafer is held temporarily in one of the stand-by spaces 24A to 24D. The stand-by spaces 24A to 24D are indicated by circles indicated by chain lines in FIG. 1. Actually, the stand-by spaces 24A to 24D are spaces through which the wafer W is able to pass. Position sensors 26-1, 26-2, 26-3, 26-4 and 26-5 for detecting the perimeter of a wafer W are disposed in pairs in the stand-by spaces 24A to 24D. The position sensors 26-2, 26-3 and 26-4 are assigned to both the adjacent stand-by spaces 24A and 24B, both the adjacent stand-by spaces 24B and 24C and both the adjacent stand-by spaces 24C and 24D for common use, respectively.

The position sensor 26-2 is used both for detecting a wafer placed in the stand-by space 24A and for detecting a wafer placed in the stand-by space 24B, the position sensor 26-3 is used both for detecting a wafer placed in the stand-by space 24B and for detecting a wafer placed in the stand-by space 24C, and position sensor 26-4 is used both for detecting a wafer placed in the stand-by space 24C and for detecting a wafer placed in the stand-by space 24D.

FIG. 2 shows, by way of example, the position sensor 26-3 disposed for use both for detecting a wafer placed in stand-by space 24B and for detecting a wafer placed in the stand-by space 24C in an enlarged view. The position sensors are, for example, linear sensors of the same type. The position sensor 26-3 as a representative example will be described with reference to FIG. 4. The position sensor 26-3 includes a light-emitting device 30 that emits a laser beam LA and a photodetector 32 disposed opposite to the light-emitting device 30. The laser beam LA emitted by the light-emitting device 31 is a flat beam of laser light having a width L1 on the order of 30 mm. The photodetector 32 is spaced a distance slightly greater than the thickness of the wafer W apart from the light-emitting device 30. The photodetector 32 is provided with a photoelectric element 32A of a length substantially equal to the width L1 of the laser beam LA. When a part of the laser beam LA of the width L1 is intercepted by a peripheral part of the wafer W, the length or the position of the intercepted part of the laser beam LA is measured accurately by the photodetector 32.

The angular interval α about the center O1 of turning of the transfer mechanism 14 between the adjacent stand-by spaces 24A and 24B, between the adjacent stand-by spaces 24B and 24C and between the adjacent stand-by spaces 24C and 24D is about 60°. The position sensors 26-1 to 26-5 are disposed with the photoelectric elements 32A thereof aligned with a line passing reference points 28A to 28D corresponding to the center of a wafer W accurately held in the stand-by spaces 24A to 24D, to which those sensors are assigned, respectively. The distances between the center O1 of turning of the transfer mechanism 14 and the reference points 28A to 28D are substantially equal to the distances between the reference points 28A and 28B, between the reference points 28B and 28C, and between the reference points 28C and 28D; that is, the center O1 of the transfer mechanism 14 and the reference points 28A and 28b, the center O1 of the transfer mechanism 14 and the reference points 28B and 28C, the center O1 of the transfer mechanism 14 and the reference points 28C and 28D are on the vertices of equilateral triangles.

Referring to FIG. 3 showing a control system for controlling the transfer mechanism 14, detection signals provided by the position sensors 26-1 to 26-5 are given to a control unit 34, such as a microcomputer. The control unit 34 controls a motor 36 for driving the transfer mechanism 14 for turning, bending and stretching.

The operation of the processing system will be described hereinafter. A teaching operation is executed to teach the control system the stand-by spaces that are used as references for determining the dislocation of the wafer W before starting processing operations. The electrostatic chucks of the supporting tables 9A to 9D are turned off. Wafers W are mounted properly on the supporting tables 9A to 9D with the centers thereof accurately coincided with the centers 38A to 38D of the supporting tables 9A to 9D, respectively.

Figure 5:
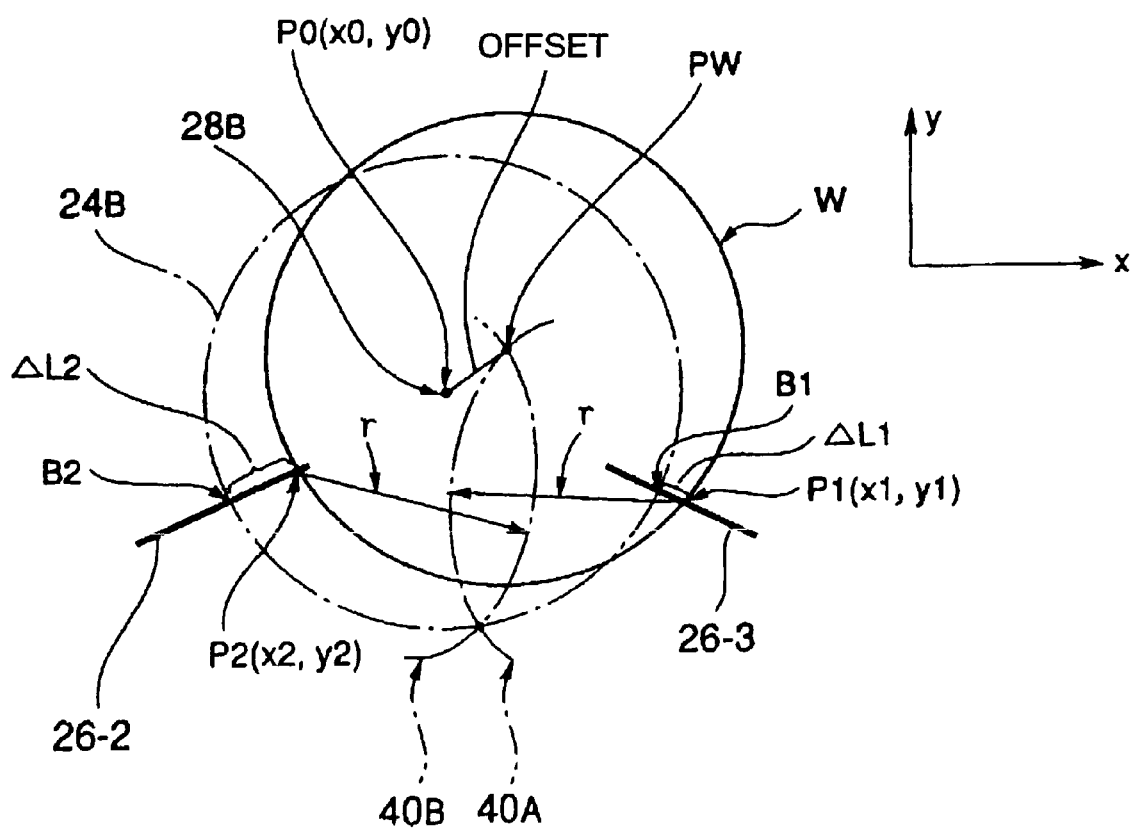
FIG. 5 is a diagram of assistance in geometrically explaining a method of determining an offset of an object to be processed from a correct position.

The processing vessels 8A to 8D and the common transfer vessel 4 are evacuated, the transfer mechanism 14 is driven to transfer the wafers W from the supporting tables 9A to 9D to the corresponding stand-by spaces 24A to 24D. The positions of the wafers W in the stand-by spaces 24A to 24D are measured by the position sensors 26-1 to 26-5. Detection signals provided by the position sensors 26-1 to 26-5 in this state are used as reference signals respectively representing zero points in the stand-by spaces 24A to 24D. Offsets of wafers W from the zero points in the stand-by spaces 24A to 24D are determined with reference to the reference signals. In FIG. 5, the outline of the wafer W correctly placed in the stand-by space 24B is indicated by a chain line.

A general procedure for processing a semiconductor wafer W will be described by way of example. An unprocessed semiconductor wafer W is taken out from a cassette placed in, for example, the first cassette loading/unloading vessel 12A by the transfer mechanism 14 and is carried from the first cassette loading/unloading vessel 12A through the open gate valve 10A into the common transfer vessel 4 by turning, bending and stretching the transfer mechanism 14 holding the semiconductor wafer W by the holding device held on the extremity of the arm 16. Subsequently, the transfer mechanism 14 is controlled so as to carry the semiconductor wafer W toward, for example, the processing vessel 8B. The transfer mechanism 14 is stopped to hold the semiconductor wafer W temporarily in the stand-by space 24B. Then, an offset of the center of the wafer W from the center O2 of the holding device held on the arm 16 is measured, which will be explained later.

The transfer mechanism 14 is stretched out to carry the wafer W through the open gate valve 6B into the processing vessel 8B and the wafer W is mounted on the supporting table 9B. Then, the electrostatic chuck is turned on to hold the wafer W fixedly on the supporting table 9B by the attraction of the electrostatic chuck. When mounting the wafer W on the supporting table 9B by stretching out the transfer mechanism 14 again, the control unit 34 controls the operation of the transfer mechanism 14 so as to correct the dislocation of the wafer W.

After the carrying operation of the transfer mechanism 14 has been completed, the wafer W is subjected to a predetermined process in the processing vessel 8B. After the termination of the process, the electrostatic chuck is turned off, static electricity is eliminated from the wafer W, the gate valve 6B is opened, the transfer mechanism 14 is stretched out into the processing vessel 8B, and the wafer W is held by the holding device held on the extremity of the arm 16 of the transfer mechanism 14. Then, the arm 16 of the transfer mechanism 14 is retracted to take out the wafer W from the processing vessel 8B into the common transfer vessel 4. If static electricity is not properly eliminated from the wafer W, it is possible that the wafer W jumps when the wafer W is held by the holding device held on the arm 16 and that wafer W is dislocated from a correct position on the arm 16.

Then, the transfer mechanism 14 is turned to move the wafer W toward, for example, the processing vessel 8C to subject the wafer W to the next process in the processing vessel 8C. The wafer W is stopped temporarily in the stand-by space 24C and an offset of the wafer W from the reference point 28C is measured. The operation of the transfer mechanism 14 is controlled on the basis of the result of measurement so as to correct the offset to place the wafer W correctly on the supporting table 9C. The foregoing operations are repeated to subject the wafer W to other necessary processes. After all the necessary processes have been completed, the wafer W is carried to the second cassette loading/unloading vessel 12B and is put in a cassette kept in the second cassette loading/unloading vessel 12B.

The measurement and correction of the offset will be explained with reference to FIGS. 5 and 6. FIG. 5 is a diagram of assistance in explaining a method of measuring and correcting the offset of the wafer W in the stand-by space 24B corresponding to the processing vessel 8B by way of example. This method applies to the measurement and correction of the offset of the wafer W in any one of the other stand-by spaces. In FIG. 5, the stand-by space 24B is represented by a circle of a diameter equal to that of the wafer W. The reference point 28B (P0) having the coordinates $(x_0, y_0)$ and the reference points B2 and B1 of the position sensors 26-2 and 26-3 are taught beforehand to the control system. The radius r of the wafer W is known. Suppose that the wafer W is dislocated in the stand-by space 24B and the perimeter of the wafer W is at a position indicated by continuous line in FIG. 5. Then, the distance between the center PW of the wafer W and the reference point P0 is an offset.

Suppose that the perimeter of the wafer W intersects the laser beams of the position sensors 26-3 and 26-2 at a point P1 (X1, Y1) and a point P2(X2, Y2), respectively. The distance between the point P1 and the reference point B1 is ΔL1 and the distance between the point P2 and the reference point B2 is ΔL2. An arc 40A of a circle having a center at the point P1 and a radius r and an arc 40B of a circle having a center at the point P2 and a radius r intersect each other at two intersection points. The intersection point PW of the two intersection points coincides with the center of the wafer W. Thus, the coordinates of the point PW can be determined and the offset can be determined.

Figure 6:
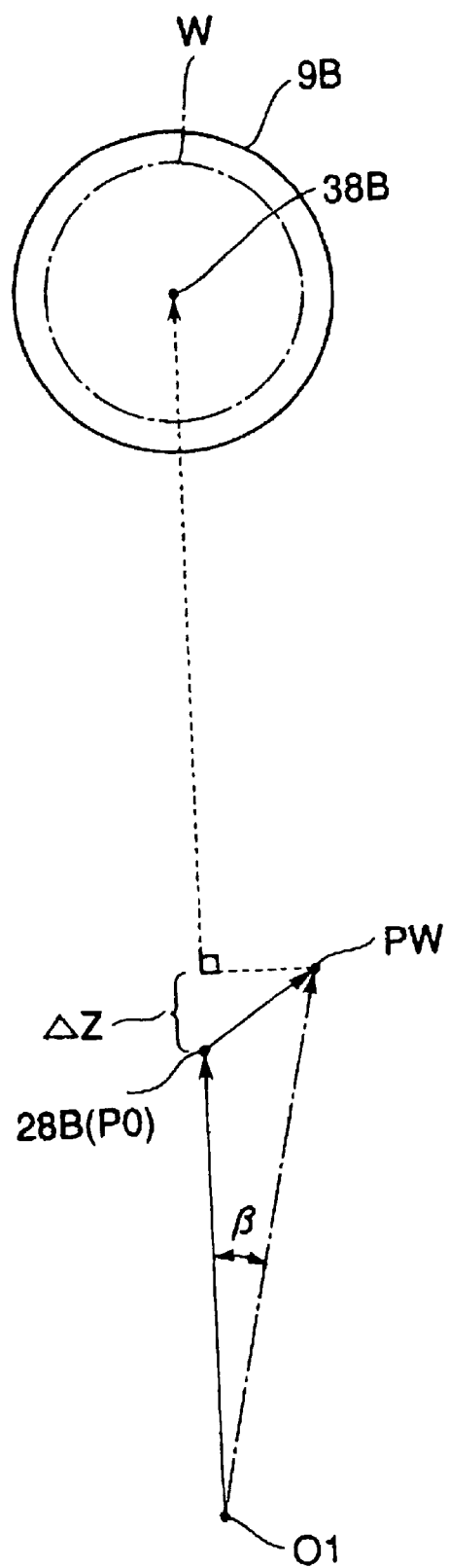
FIG. 6 is a diagram of assistance in geometrically explaining the dislocation of an object to be processed.

Referring to FIG. 6, O1 indicates the center of turning of the transfer mechanism 14 (FIG. 1) and 38B indicates the center of the supporting table 9B placed in the processing vessel 8B (FIG. 1).

Since the coordinates of the points P0 and PW are determined, the angular offset β from the point P0 about the center O1 and a linear offset ΔZ from the point P0 in a direction toward the center 38B of the supporting table 9B can be calculated. The control unit 34 executes calculations for calculating the angular offset β and the linear offset ΔZ. The control unit 34 controls the operation of the transfer mechanism 14 so that the angular offset β and the linear offset ΔZ are corrected to place the wafer W correctly on the supporting table 9B. A series of operations described herein is an example of an algorithm for correction; correcting operations may be defined by any suitable algorithm.

Thus the offset of the wafer W from a correct position on the transfer mechanism 14 can be measured by the position sensors and the transfer mechanism 14 is controlled so that the offset can be corrected. Consequently, the wafer W held by the transfer mechanism 14 can be correctly placed on the supporting tables 9A to 9D of the processing vessels 8A to 8D. Since the position sensors 26-2, 26-3 and 26-4 are assigned to both the adjacent stand-by spaces 24A and 24B, both the adjacent stand-by spaces 24B and 24C and both the adjacent stand-by spaces 24C and 24D, respectively, the number of the position sensors is small and the cost of the processing system can be reduced accordingly.

Since the position of the wafer W is corrected when the wafer W is carried into each of the processing vessels 8A to 8D, the offsets are not accumulated. If the offset is excessively great and cannot be corrected by controlling the operation of the transfer mechanism 14, the control unit 34 stops the operation of the transfer mechanism 14, and then the transfer mechanism waits for manual adjustment by the operator.

When carrying the wafer W into the cassette loading/unloading vessel 12A or 12B, the position of the wafer W can be corrected by the same procedure as the foregoing correcting procedure for correcting the offset of the wafer when carrying the wafer W into each of the processing vessels 8A to 8D. Thus, the wafer W can be properly put in the cassette kept in the cassette loading/unloading vessel 12A or 12B.

Although the invention has been described as applied to a processing system in which the stand-by spaces 24A to 24D are defined respectively for the processing vessels 8A to 8D, the present invention is not limited to such a processing system; the processing system may be provided with stand-by spaces common to the processing vessels 8A to 8D and the cassette loading/unloading vessels 12A and 12B. When the processing system is provided with a single stand-by space, it is possible to enable the processing system to achieve the measurement of the offset of the wafer by using a single position sensor by devising a method of measuring the offset of the wafer by the single position sensor.

Figure 7:
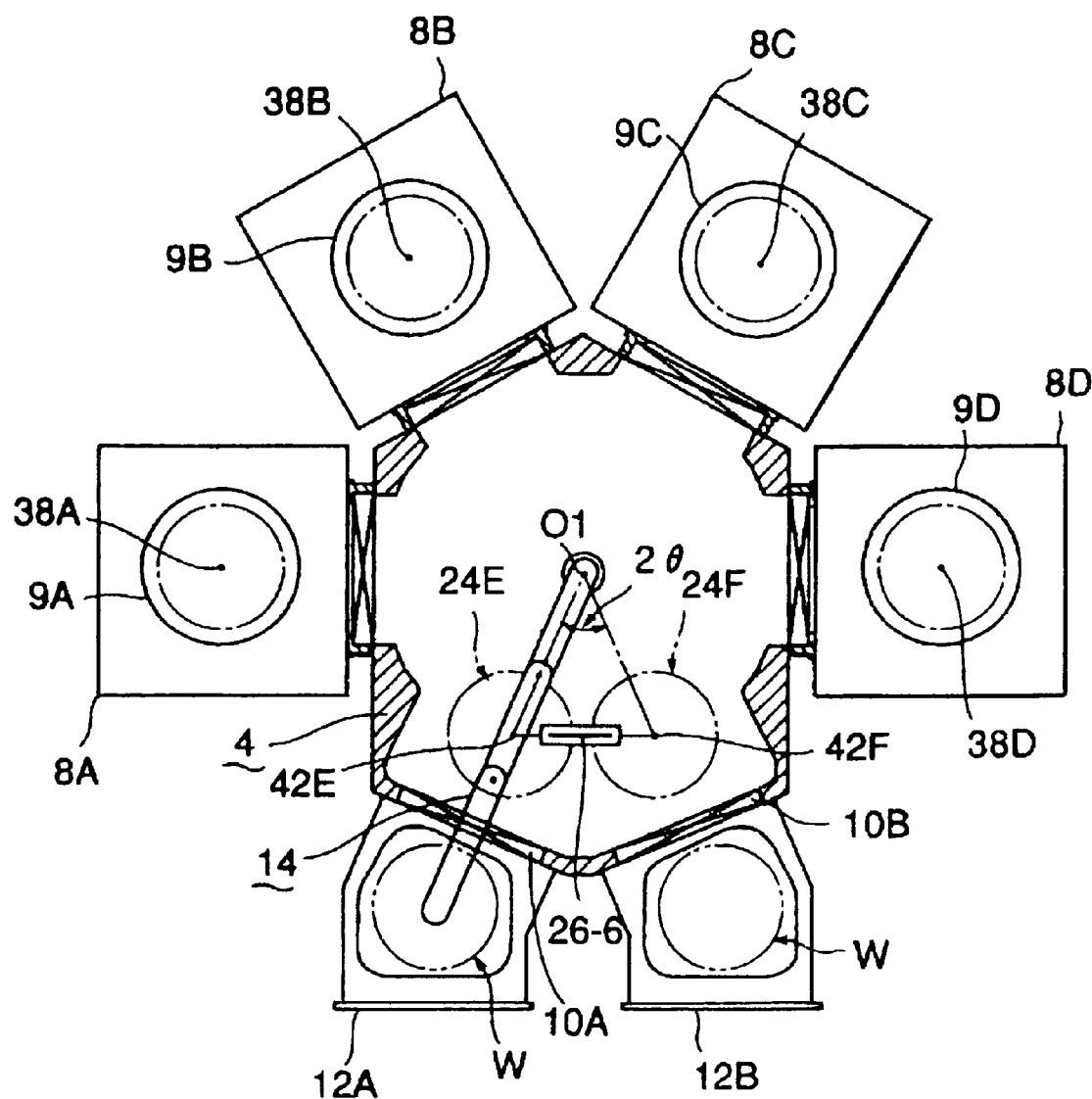
FIG. 7 is a sectional plan view of a processing system in a second embodiment according to the present invention.
Figure 8:
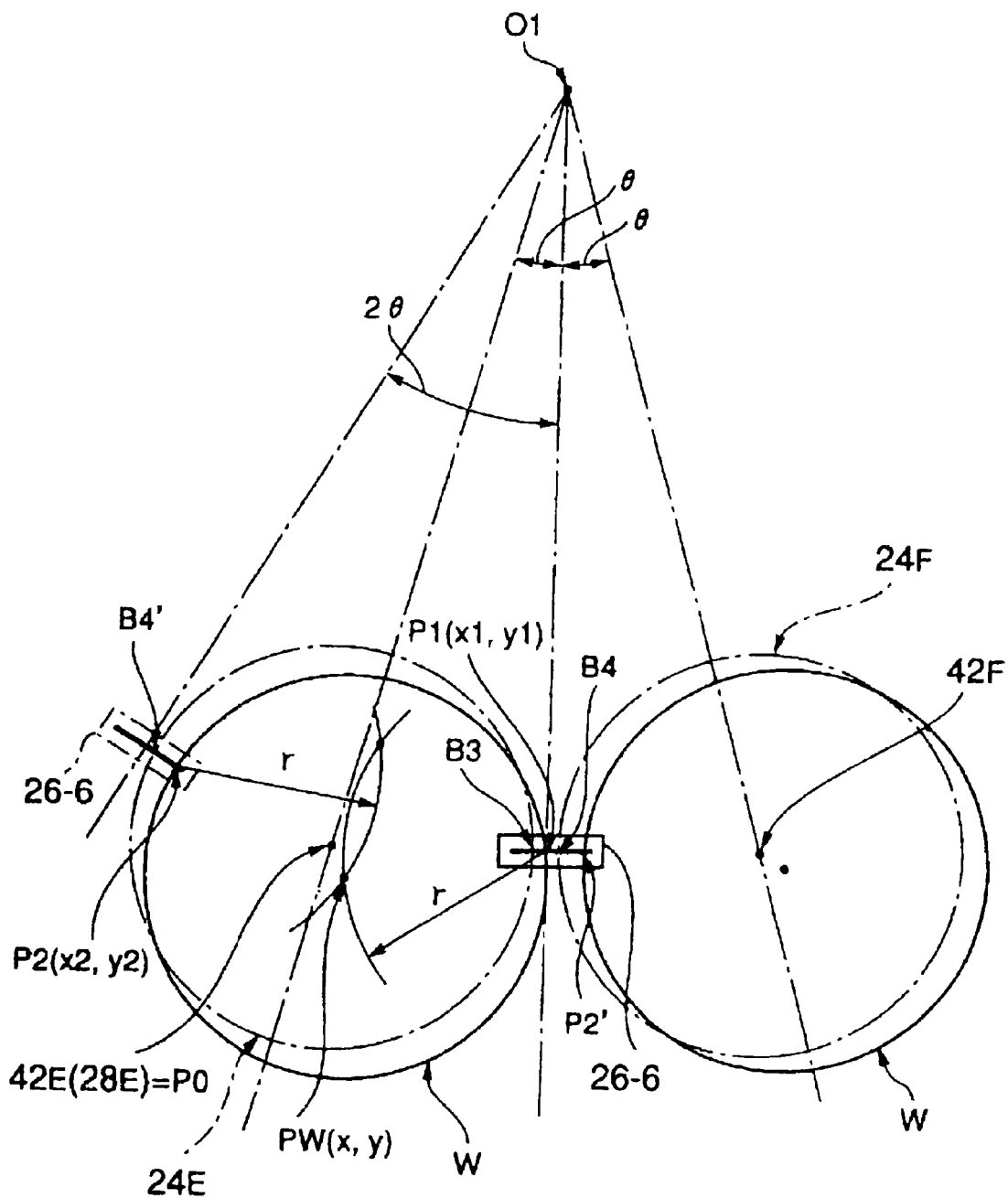
FIG. 8 is a diagram of assistance in geometrically explaining a method of determining an offset by the processing system shown in FIG. 7.
Figure 9:
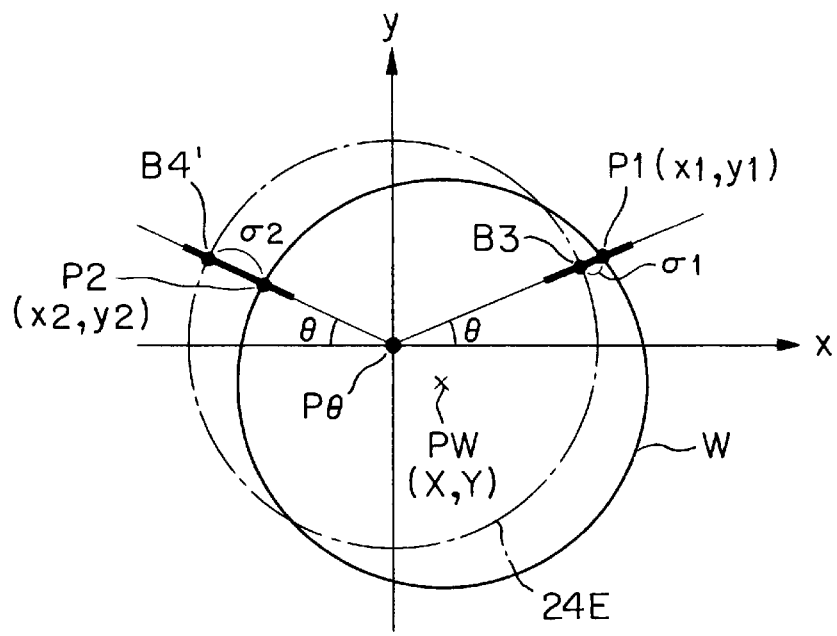
FIG. 9 is a diagram of assistance in geometrically explaining a procedure for determining the coordinates of the center of a wafer by the method explained in connection with FIG. 8.

FIG. 7 is a sectional plan view of a processing system in a second embodiment according to the present invention provided with a single position sensor, FIG. 8 is a diagram of assistance in geometrically explaining a method of determining an offset by the processing system shown in FIG. 7, and FIG. 9 is a diagram of assistance in geometrically explaining a procedure for determining the coordinates of the center of a wafer by the method explained in connection with FIG. 8. In FIG. 7 parts like or corresponding to those shown in FIG. 1 are denoted by the same reference characters and the description thereof will be omitted.

Referring to FIG. 7, two stand-by spaces 24E and 24F are located in front of the gate valves 10A and 10B for the two cassette loading/unloading vessels 12A and 12B in the common transfer vessel 4. The centers of the stand-by spaces 24E and 24F are on a line passing the center O1 of turning of the transfer mechanism 14 and the center of the cassette loading/unloading vessel 12A and on a line passing the center O1 of turning of the transfer mechanism 14 and the center of the cassette loading/unloading vessel 12B, respectively. The angle between the line passing the center O1 and the center of the cassette loading/unloading vessel 12A and the line passing the center O1 and the center of the cassette loading/unloading vessel 12B is 2θ. A position sensor 26-6 is disposed so as to extend over adjacent portions of the stand-by spaces 24E and 24F. As shown in FIG. 4, the position sensor 26-6 includes a light-emitting device 30 that emits a laser beam LA and a photodetector 32 disposed opposite to the light-emitting device 30. The position sensor 26-6 is disposed with the photoelectric element 32A thereof aligned with a line passing the respective centers 42E and 42F of the stand-by spaces 24E and 24F. As mentioned previously in connection with FIG. 3, a detection signal provided by the position sensor 26-6 is given to the control unit 34. The control unit 34 carries out a control procedure to control the operation of the transfer mechanism 14, which will be described later.

A method of measuring an offset of a wafer from a correct position and correcting the offset will be described with reference to FIGS. 8 and 9. A teaching operation is executed before starting processing operations to teach the positions of the two stand-by spaces 24E and 24F, i.e., reference positions for measuring the dislocation of the wafer, to the control unit 34. As mentioned above, the electrostatic chucks of the supporting tables 9A to 9D are turned off and wafers W are mounted accurately on the supporting tables 9A to 9D.

The processing vessels 8A to 8D and the common transfer vessel 4 are evacuated, the transfer mechanism 14 is driven to transfer the wafers W from the supporting tables 9A to 9D. Each wafer W is stopped sequentially in the stand-by spaces 24E and 24F. Positions of each wafer W in the stand-by spaces 24E and 24F measured by the position sensor 26-6 are used as reference positions, i.e., zero points, for determining an offset of the wafer W. Suppose that the perimeters of the stand-by spaces 24E and 24F intersects the position sensor 26-6 at points B3 and B4, respectively, as shown in FIG. 8.

If the processing system is assembled very accurately, all the detection signals provided by the position sensor 26-6 upon the detection of the wafers W carried from the supporting tables 9A to 9D coincide accurately with each other. However, since the processing system inevitably has dimensional errors, a zero point table specifying zero points for the supporting tables 9A to 9D is stored in the control unit 34. The wafer W can be moved between the stand-by spaces 24E and 24F by turning the transfer mechanism 14 through an angle of 2θ.

Then, the control unit 34 executes polar coordinate transformation to turn the stand-by space 24F and the position sensor 26-6 clockwise, as viewed in FIG. 8, through an angle 2θ about the center O1 of turning of the transfer mechanism 14. Consequently, a point B4' is the reference point on the position sensor 26-6, after the polar coordinate transformation, for convenience. One of the intersection points of an arc of a circle having a radius r equal to that of the wafer W and its center at the reference point B3 and an arc of a circle having a radius r and its center at the reference point B4' nearer to the center 42E of the stand-by space 24E is a reference point 28E (=P0) for determining offset. In the diagram shown in FIG. 8, 42E and 28E indicates the same point on an assumption that the processing system does not have any error.

The measurement of an offset of the wafer W from a correct position in one of the processing vessels will be explained by way of example with reference to FIG. 8. The respective centers of the stand-by spaces 24E and 24F indicated by chain lines in FIG. 8 are at the reference points 42E and 42F, respectively, and the center of the position sensor 26-6 is on a line bisecting the angle 2θ between the line passing the centers O1 and 42E and the line passing the centers O1 and 42F.

Suppose that the wafer W is dislocated from the correct positions in the stand-by spaces 24E and 24F and the perimeter of the wafer W placed in the stand-by spaces 24E and 24F lies as indicated by continuous lines in FIG. 8, the perimeter of the wafer W intersects the position sensor 26-6 at points P1 and P2', and the perimeter of the wafer W intersects the position sensor 26-6 at a point P2 in a state after polar coordinate transformation turning the wafer W in the stand-by space 24F and the position sensor 26-6 clockwise, as viewed in FIG. 8, toward the stand-by space 24E.

One of the two intersection points where an arc of a circle having a radius r and its center at the point P1 and an arc of a circle having a radius r and its center at the point P2 nearer to the point 28E is the center PW (X, Y) of the wafer W.

An algorithm for calculating the center PW(X, Y) will be described with reference to FIG. 9. In FIG. 9, the point P0 (28E) is the origin, the y-axis passes the origin P0 and the center O1 of turning of the transfer mechanism 14, and (X1, Y1) and (X2, Y2) are the coordinates of the points P1 and P2, respectively.

$$P1(X1, Y1) = [(r+\sigma 1)\cos\theta, (r+\sigma 1)\sin\theta]$$

$$P2(X2, Y2) = [(r+\sigma 2)\cos(180-\theta), (r+\sigma 2)\sin(180-\theta)]$$

$$= [-(r+\sigma 2)\cos\theta, (r+\sigma 2)\sin\theta]$$

where σ1 is an offset of the point P1 from the reference point B3 measured by the position sensor 26-6 and σ2 is an offset of the point P2 from the reference point B4' measured by the position sensor 26-6.

When the position of the intersection point PW, the center PW of the wafer W, is represented by the coordinates (X, Y) and the wafer W has a radius r, $$(X-X1)^2+(Y-Y1)^2=r^2 \quad (1)$$

$$(X-X2)^2+(Y-Y2)^2=r^2 \quad (2)$$

The x-axis and the y-axis are translated by +X1 and +Y1, respectively, to simplify Expressions (1) and (2) as follows.

$$X^2+Y^2=r^2$$

$$[X-(X2-X1)]^2+[Y-(Y2-y1)]^2=r^2$$

When X2−X1=a and Y2−Y1=b, $$X^2+Y^2=r^2 \quad (3)$$

$$(X-a)^2+(Y-b)^2=r^2 \quad (4)$$

From Expressions (3) and (4), $$X^2-2aX+a^2+Y^2-2bY+b^2=X^2+Y^2$$

Therefore, $$2aX+2bY-a^2-b^2=0 \quad (5)$$

Thus, X and Y are expressed by Expressions (6) and (7).

$$X=(a^2+b^2-2bY)/2a=(m-2bY)/2a \quad (6)$$

$$Y=(a^2+b^2-2aX)/2b=(m-2aX)/2b \quad (7)$$

where m=a²+b².

Substituting Expression (7) into Expression (3) we obtain, $$X^2+\{(m-2aX)/2b\}^2=r^2$$

Therefore, $$4(a^2+b^2)X^2-4maX+(m^2-4b^2r^2)=0$$

Since a²+b²=m², $$4mX^2-4maX+(m^2-4b^2r^2)=0$$

Solving this equation for X we obtain, $$X=[ma\pm\{m^2a^2-m(m^2-4b^2r^2)\}^{1/2}]/2m=\{a\pm(a^2-m+4b^2r^2/m)^{1/2}\}/2$$

Since $m=a^2+b^2$, $$X=[a\pm\{a^2-(a^2+b^2)+4b^2r^2/(a^2+b^2)\}^{1/2}]/2=\{a\pm b(4r^2/m-1)^{1/2}\}/2$$

Substituting X into Expression (5) we obtain, $$2a\{a\pm b(4r^2/m-1)^{1/2}\}/2+2bY-a^2-b^2=0$$

Therefore, $$Y=\{b\pm a(4r^2/m-1)^{1/2}\}/2$$

Thus, the coordinates (X, Y) of the two intersection points of the two arcs are expressed as follows.
First intersection point:

$$(\{a+b(4r^2/m-1)^{1/2}\}/2, \{b-a(4r^2/m-1)^{1/2}\}/2)$$

Second intersection point:

$$(\{a-b(4r^2/m-1)^{1/2}\}/2, \{b+a(4r^2/m-1)^{1/2}\}/2)$$

Since the x-axis and the y-axis are translated by +X1 and +Y1, respectively, the coordinates are rewritten as follows.
First intersection point:

$$(\{a+b(4r^2/m-1)^{1/2}\}/2+X1, \{b-a(4r^2/m-1)^{1/2}\}/2+Y1)$$

Second intersection point:

$$(\{a-b(4r^2/m-1)^{1/2}\}/2+X1, \{b+a(4r^2/m-1)^{1/2}\}/2+Y1)$$

where $m=a^2+b^2$, $a=X2-X1$ and $b=Y2-y1$.

Either the first or the second intersection point is used as the coordinates of the center PW of the wafer W. The point where the offset $\sigma=(X2+Y2)^{1/2}$ of the point meets an inequality: $\sigma<\Delta1/2$, where $\Delta1$ is the length of the photodetector, is used as the center of the wafer W.

Thus, the coordinates (X, Y) of the point PW is determined and hence an offset of the point PW from the point P0 (the point 28E or 42E in FIG. 8) can be determined. The control unit 34 controls the operation of the transfer mechanism 14 so as to correct the offset.

Although the procedure for measuring and correcting the offset of the wafer relative to the processing vessels 8A to 8D, the same procedure applies to the measurement and correction of an offset of the wafer relative to the cassette loading/unloading vessels 12A, 12B, a cooling vessel, a heating vessel and the like.

What is claimed is:

1. A processing system comprising:
a plurality of processing vessels, in which an object to be processed is subjected to predetermined processes, provided with openings, respectively;
a common transfer vessel connected to the openings of the processing vessels and internally having stand-by spaces, where the object is held temporarily, determined so as to correspond to the openings of the processing vessels, respectively;
a transfer mechanism installed in the common transfer vessel to transfer the object between the common transfer vessel and the processing vessels and capable of turning, bending and stretching;
a plurality of pairs of position sensors assigned to the stand-by spaces to measure positions of a perimeter of the object and arranged so that each stand-by space shares one of the pair of position sensors with the adjacent stand-by space for common use; and
a control means that determines an offset of the object held by the transfer mechanism on the basis of the position of the perimeter of the object detected by the position sensors and controls operation of the transfer mechanism so as to correct the offset of the object.

2. The processing system according to claim 1, wherein the stand-by spaces are arranged about a center of turning of the transfer mechanism at angular intervals of about 60°.

3. The processing system according to claim 1, wherein the position sensors are linear optical sensors each having a photodetector of a predetermined length, and each position sensor is disposed so that the photodetector is aligned with a line passing the center of the object accurately placed in the corresponding stand-by space.

4. The processing system according to claim 1, wherein the control means stops the operation of the transfer mechanism when the offset of the object is not smaller than a predetermined value.

5. A processing system comprising:
a processing vessel, in which an object to be processed is subjected to predetermined processes, provided with an opening;
a transfer vessel connected to the opening of the processing vessel and internally having first and second stand-by spaces having centers spaced a predetermined angular interval apart, where an object to be processed is held temporarily;
a transfer mechanism installed in the transfer vessel to transfer an object to be processed between the transfer vessel and the processing vessel, capable of turning, bending and stretching and having a center of turning about which the first and second stand-by spaces are arranged at an angular interval;
a position sensor disposed so as to extend over the first and second stand-by spaces to measure a position of the perimeter of the object; and
a control means that carries out a control procedure including the steps of:
determining a position of the perimeter of the object held by the transfer mechanism and located in the first stand-by space by the position sensor,
making the transfer mechanism turn through an angle equal to the angular interval between the first and the second stand-by space to locate the object in the second stand-by space,
determining the position of the perimeter of the object located in the second stand-by space by the position sensor,
determining an offset of the object on the basis of the positions of the perimeter of the object as located in the first and the second stand-by space detected by the position sensor, and
controlling the operation of the transfer mechanism so as to correct the offset of the object.

6. The processing system according to claim 5, wherein the position sensor is a linear optical sensor having a photodetector of a predetermined length, and the position sensor is disposed so that the photodetector is aligned with a line passing the center of the object accurately placed in either of the first and the second stand-by space.

7. The processing system according to claim 5, wherein the control means stops the operation of the transfer mechanism when the offset of the object is not smaller than a predetermined value.

* * * * *